(12) United States Patent
Kim

(10) Patent No.: US 11,581,054 B2
(45) Date of Patent: Feb. 14, 2023

(54) SEMICONDUCTOR DEVICES DETECTING A DEFECTIVE BUFFER CIRCUIT

(71) Applicant: SK hynix Inc., Icheon-si (KR)

(72) Inventor: Kwang Soon Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 102 days.

(21) Appl. No.: 17/149,584

(22) Filed: Jan. 14, 2021

(65) Prior Publication Data

US 2022/0076771 A1 Mar. 10, 2022

(30) Foreign Application Priority Data

Sep. 8, 2020 (KR) .................. 10-2020-0114790

(51) Int. Cl.
*G11C 29/38* (2006.01)
*G11C 29/54* (2006.01)

(52) U.S. Cl.
CPC .................. *G11C 29/38* (2013.01)

(58) Field of Classification Search
None
See application file for complete search history.

(56) References Cited

U.S. PATENT DOCUMENTS

| | | | | |
|---|---|---|---|---|
| 5,946,209 A * | 8/1999 | Eckel | ............... | H05B 47/10 315/159 |
| 6,260,975 B1 * | 7/2001 | Nagano | ............... | H04W 52/52 323/205 |
| 7,332,929 B1 * | 2/2008 | Normoyle | ............... | G01R 31/3177 714/39 |
| 8,793,525 B2 | 7/2014 | Zerbe et al. | | |
| 10,198,015 B1 * | 2/2019 | Ham | ............... | G05F 1/575 |
| 11,029,721 B2 * | 6/2021 | Huang | ............... | G06F 1/12 |
| 2002/0097177 A1 * | 7/2002 | Nagaraj | ............... | H03M 1/36 341/155 |
| 2007/0208262 A1 * | 9/2007 | Kovacs | ............... | A61B 5/332 600/509 |
| 2008/0018586 A1 * | 1/2008 | Yang | ............... | G09G 3/3688 345/100 |
| 2010/0259298 A1 * | 10/2010 | Huang | ............... | H03K 19/0013 326/71 |
| 2012/0027050 A1 * | 2/2012 | Bourdel | ............... | H04B 1/71632 327/291 |
| 2012/0331346 A1 * | 12/2012 | Oshima | ............... | G01R 31/1932 714/E11.178 |

(Continued)

FOREIGN PATENT DOCUMENTS

KR 100800133 B1 2/2008

*Primary Examiner* — Cynthia Britt
*Assistant Examiner* — Dipakkumar B Gandhi
(74) *Attorney, Agent, or Firm* — William Park & Associates Ltd.

(57) ABSTRACT

A semiconductor device includes a sampling code generation circuit and a code comparator. The sampling code generation circuit includes a buffer circuit configured to receive an external set signal. The sampling code generation circuit is configured to perform a count operation during a sampling period, the sampling period adjusted based on an output signal of the buffer circuit to generate a sampling code. The code comparator is configured to compare the sampling code with a reference code to generate a comparison flag.

23 Claims, 15 Drawing Sheets

(56) References Cited

U.S. PATENT DOCUMENTS

| | | | |
|---|---|---|---|
| 2015/0264136 A1* | 9/2015 | Hall | H04L 65/60 |
| | | | 709/248 |
| 2017/0318250 A1* | 11/2017 | Sakakibara | H04N 5/3745 |
| 2019/0305772 A1* | 10/2019 | Kawata | H03K 17/122 |
| 2019/0362804 A1* | 11/2019 | Kim | G11C 29/26 |
| 2020/0110124 A1* | 4/2020 | Schweitzer, III | G01R 31/085 |

\* cited by examiner

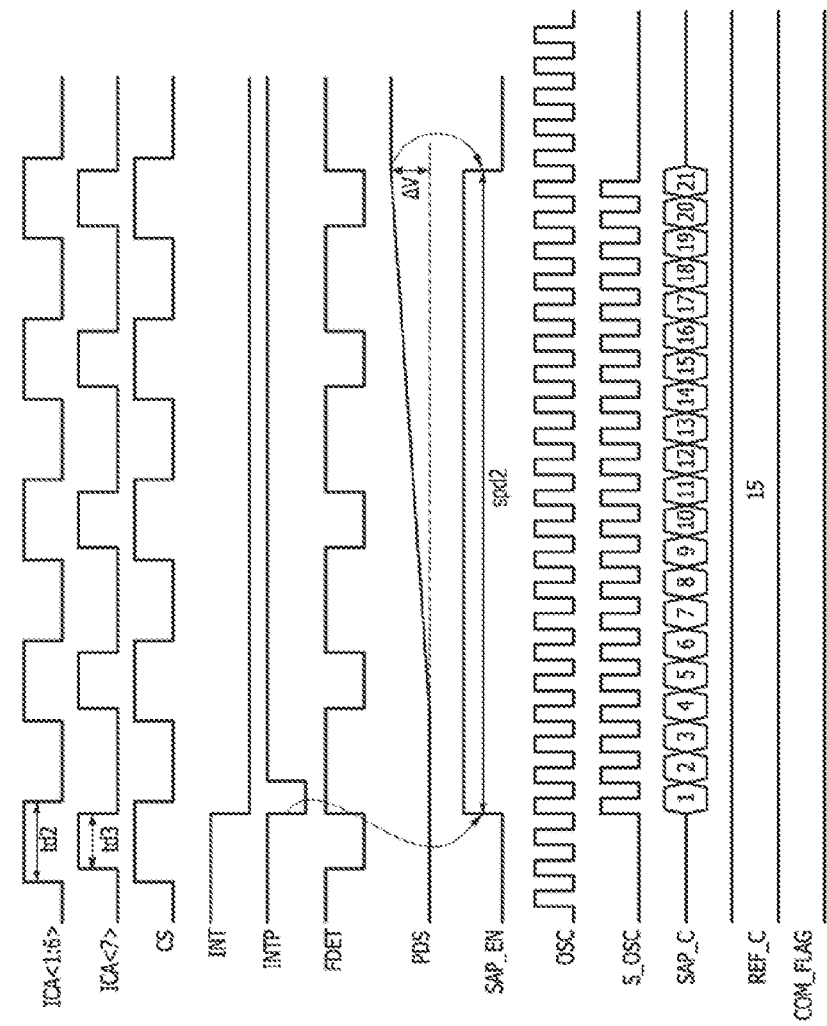

SEMICONDUCTOR DEVICES DETECTING A DEFECTIVE BUFFER CIRCUIT

CROSS-REFERENCE TO RELATED APPLICATIONS

The present application claims priority under 35 U.S.C 119(a) to Korean Application No. 10-2020-0114790, filed on Sep. 8, 2020, which is incorporated herein by reference in its entirety.

BACKGROUND

1. Technical Field

Embodiments of the present disclosure relate to semiconductor devices detecting a defective buffer circuit.

2. Related Art

Semiconductor devices may receive a command and an address to perform various internal operations, such as an active operation, a write operation, a read operation, a pre-charge operation, and the like. Each of the semiconductor devices may include a plurality of buffers to receive the command, the address, and a chip selection signal. In such a case, when at least one of the buffers is a defective buffer, the defective buffer may cause malfunction of the semiconductor device performing the internal operations which are executed based on the command, the address, the chip selection signal, and the like.

SUMMARY

According to an embodiment, a semiconductor device includes a sampling code generation circuit and a code comparator. The sampling code generation circuit may include a buffer circuit receiving an external set signal. The sampling code generation circuit may be configured to perform a count operation during a sampling period, which may be adjusted based on an output signal of the buffer circuit, to generate a sampling code. The code comparator may be configured to compare the sampling code with a reference code to generate a comparison flag.

According to another embodiment, a semiconductor device may include a sampling code generation circuit and a code comparator. The sampling code generation circuit may be configured to sample an oscillation signal during a sampling period, which may be adjusted according to whether a buffer circuit is a defective circuit, to generate a sampled oscillation signal. The sampling code generation circuit may be configured to count the sampled oscillation signal to generate a sampling code. The code comparator may be configured to compare the sampling code with a reference code to generate a comparison flag.

According to yet another embodiment, a semiconductor device may include a buffer circuit configured to receive a command/address signal and a chip selection signal to generate an internal command/address signal and an internal chip selection signal, a failure detection signal generation circuit configured to generate a failure detection signal based on the internal command/address signal and the internal chip selection signal, a drive signal output circuit configured to drive the drive signal initialized during an initialization operation based on the failure detection signal such that a logic level transition of the drive signal occurs, a sampling code output circuit configured to generate the sampling code based on an initialization pulse and the drive signal, and a code comparator configured to compare the sampling code with a reference code to generate a comparison flag.

BRIEF DESCRIPTION OF THE DRAWINGS

FIGS. 9, 10, 11, 12, 13, 14, and 15 illustrate a test operation of the semiconductor device illustrated in FIGS. 1 to 8.

DETAILED DESCRIPTION

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage correspond to a signal having a logic "high" level, a signal having a second voltage correspond to a signal having a logic "low" level. In an embodiment, the logic "high" level may be set as a voltage level which is higher than a voltage level of the logic "low" level. Meanwhile, logic levels of signals may be set to be different or opposite according to the embodiments. For example, a certain signal having a logic "high" level in one embodiment may be set to have a logic "low" level in another embodiment, or vice versa.

Various embodiments of the present disclosure will be described hereinafter with reference to the accompanying drawings. However, the embodiments described herein are for illustrative purposes only and are not intended to limit the scope of the present disclosure.

Figure 1:
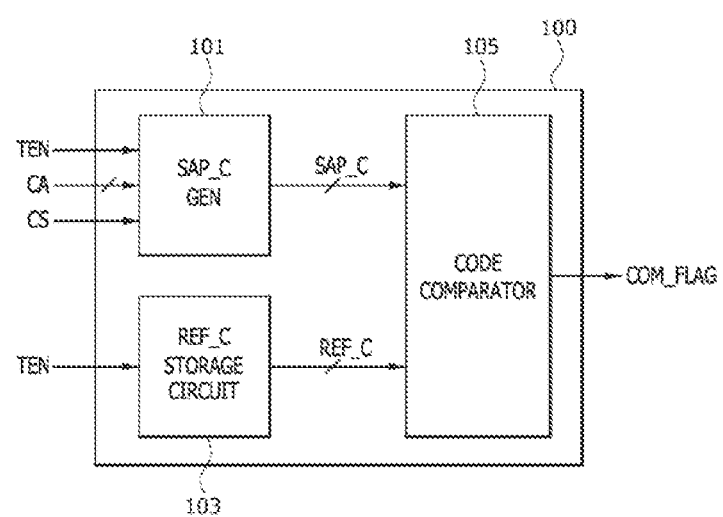
FIG. 1 is a block diagram illustrating a configuration of a semiconductor device according to an embodiment of the present disclosure.

As illustrated in FIG. 1, a semiconductor device 100 according to an embodiment may include a sampling code generation circuit (SAP_C_GEN) 101, a reference code storage circuit (REF_C_STORAGE_CIRCUIT) 103, and a code comparator 105.

The sampling code generation circuit 101 may receive a test signal TEN, a command/address signal CA, and a chip selection signal CS from an external device (not shown) coupled to the semiconductor device 100. The external device may include a host, a controller, a test apparatus, or the like. In some embodiments, the test signal TEN may be generated by decoding the command/address signal CA in an internal circuit included in the semiconductor device 100. Execution of a test operation may be determined according to a logic level of the test signal TEN. For example, the test operation is not performed when the test signal TEN has a first logic level, and the test operation is performed when the test signal TEN has a second logic level. Although the first logic level is set as a logic "low" level and the second logic level is set as a logic "high" level in the present embodiment, the present embodiment may be merely an example of the present disclosure. Accordingly, the present disclosure is not limited to the present embodiment. The sampling code generation circuit 101 may generate a sampling code SAP_C based on the test signal TEN and an external set signal. In the present embodiment, the external set signal may include the command/address signal CA and the chip selection signal CS. The sampling code generation circuit 101 may include a buffer circuit (131 of FIG. 4) receiving the command/address signal CA and the chip selection signal CS. Slopes of the command/address signal CA and the chip selection signal CS, which are input to the buffer circuit (131 of FIG. 4), may vary according to a logic level of the test signal TEN at a point in time when level transition of the command/address signal CA and the chip selection signal CS occurs. The sampling code generation circuit 101 may adjust a sampling period according to whether the buffer circuit (131 of FIG. 4) receiving the command/address signal CA and the chip selection signal CS includes a defective circuit and may generate the sampling code SAP_C through a count operation performed during the sampling period. A set value of the sampling code SAP_C may increase by one whenever the count operation is performed during the sampling period. For example, in the event that it is assumed that the sampling code SAP_C includes 5 bits and the count operation is performed twelve times during the sampling period, the set value of the sampling code SAP_C may have a binary stream of '01100' corresponding to a decimal number of '12'. In addition, in the event that it is assumed that the sampling code SAP_C includes 5 bits and the count operation is performed twenty-one times during the sampling period, the set value of the sampling code SAP_C may have a binary stream of '10101' corresponding to a decimal number of '21'. The sampling code SAP_C may be generated by the count operation performed during the sampling period which is set to be longer when the buffer circuit (131 of FIG. 4) is a defective circuit as compared with a case that the buffer circuit (131 of FIG. 4) has no defective circuit. In the present embodiment, the sampling code generation circuit 101 may adjust the sampling period to be longer when the buffer circuit (131 of FIG. 4) is a defective circuit as compared with a case that the buffer circuit (131 of FIG. 4) has no defective circuit. However, the present embodiment may be merely an example of the present disclosure. Accordingly, the present disclosure is not limited to the present embodiment.

The reference code storage circuit 103 may receive the test signal TEN from an external device (not shown) coupled to the semiconductor device 100. The reference code storage circuit 103 may store a reference code REF_C therein before the test operation is performed. The reference code storage circuit 103 may include a storage medium for storing the reference code REF_C. The storage medium included in the reference code storage circuit 103 may be realized using fuses (not shown), latches (not shown), or the like. The reference code storage circuit 103 may output the reference code REF_C stored therein based on the test signal TEN. The reference code storage circuit 103 may output the reference code REF_C when the test operation is performed. The reference code REF_C may include a plurality of bits. A set value of the reference code REF_C may be set to be a reference value which is capable of determining whether the buffer circuit (131 of FIG. 4) is a defective circuit. For example, when the set value of the reference code REF_C is set as a binary stream of '01111' corresponding to a decimal number of '15', a reference when the buffer circuit (131 of FIG. 4) has a defective circuit may be set as a case that the count operation is performed more than fifteen times during the sampling period.

The code comparator 105 may receive the sampling code SAP_C from the sampling code generation circuit 101 and may receive the reference code REF_C from the reference code storage circuit 103. The code comparator 105 may generate a comparison flag COM_FLAG based on the sampling code SAP_C and the reference code REF_C. The code comparator 105 may compare the sampling code SAP_C with the reference code REF_C to set a logic level of the comparison flag COM_FLAG. In the present embodiment, the code comparator 105 may generate the comparison flag COM_FLAG having the first logic level when the set value of the sampling code SAP_C is equal to or less than the set value of the reference code REF_C and may generate the comparison flag COM_FLAG having the second logic level when the set value of the sampling code SAP_C is greater than the set value of the reference code REF_C. For example, when the buffer circuit (131 of FIG. 4) has no defective circuit and the set value of the sampling code SAP_C is set as a binary stream of '01100' (corresponding to a decimal number of '12') while the set value of the reference code REF_C is set as a binary stream of '01111' (corresponding to a decimal number of '15'), the code comparator 105 may generate the comparison flag COM_FLAG having the first logic level. Similarly, when the buffer circuit (131 of FIG. 4) has a defective circuit and the set value of the sampling code SAP_C is set as a binary stream of '10101' (corresponding to a decimal number of '21') while the set value of the reference code REF_C is set as a binary stream of '01111' (corresponding to a decimal number of '15'), the code comparator 105 may generate the comparison flag COM_FLAG having the second logic level. As described above, because the comparison flag COM_FLAG includes information on whether the buffer circuit (131 of FIG. 4) is a defective circuit, it may be possible to more readily verify whether the buffer circuit (131 of FIG. 4) is a defective circuit using the comparison flag COM_FLAG.

Figure 2:
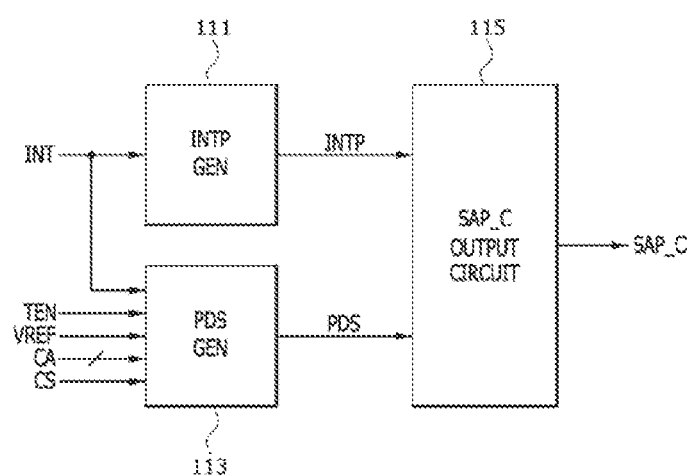
FIG. 2 is a block diagram illustrating a configuration of a sampling code generation circuit included in the semiconductor device illustrated in FIG. 1.

As illustrated in FIG. 2, the sampling code generation circuit 101 may include an initialization pulse generation circuit 111, a drive signal generation circuit 113, a sampling code output circuit 115.

The initialization pulse generation circuit 111 may generate an initialization pulse INTP based on an initialization signal INT. The initialization signal INT may be provided by an external device coupled to the semiconductor device 100 or may be generated by an internal circuit included in the semiconductor device 100, according to the embodiments. The initialization signal INT may be set to have a predetermined logic level during an initialization operation period of the semiconductor device 100. The initialization operation period of the semiconductor device 100 may be set as a period from a point in time when a power source voltage is supplied to the semiconductor device 100 until a point in time when the power source voltage supplied to the semiconductor device 100 is stabilized. However, the initialization operation period of the semiconductor device 100 may be set to be different according to the embodiments. Although the initialization signal INT is set to have the second logic level during the initialization operation period and to have the first logic level at an end point in time of the initialization operation period in the present embodiment, the present embodiment may be merely an example of the present disclosure. Thus, the present disclosure is not limited to the present embodiment. The initialization pulse generation circuit 111 may generate the initialization pulse INTP at a point in time when logic level transition of the initialization signal INT occurs. That is, the initialization pulse generation circuit 111 may generate the initialization pulse INTP in synchronization with a point in time when the initialization operation period terminates. Although the initialization pulse INTP is generated to have a logic "low" level in the present embodiment, the present embodiment may be merely an example of the present disclosure. That is, in some other embodiments, the initialization pulse INTP may be generated to have a logic "high" level.

The drive signal generation circuit 113 may generate a drive signal PDS based on the initialization signal INT, the test signal TEN, a reference voltage VREF, the command/address signal CA, and the chip selection signal CS. The drive signal generation circuit 113 may generate the drive signal PDS which is initialized to have the first logic level by the initialization signal INT having the second logic level while the initialization operation is performed. The drive signal generation circuit 113 may generate the drive signal PDS, a level of which is boosted from the first logic level into the second logic level by the command/address signal CA and the chip selection signal CS based on the reference voltage VREF, when the test operation is performed by the test signal TEN which is set to have the second logic level after a level of the initialization signal INT is changed from the second logic level into the first logic level by termination of the initialization operation. A period that is necessary for the drive signal PDS having the first logic level to reach the second logic level may be set to become longer as a period that the command/address signal CA and the chip selection signal CS having a level higher than the reference voltage VREF are input is reduced. When the buffer circuit (131 of FIG. 4) is a defective circuit, it may be difficult for the buffer circuit (131 of FIG. 4) to receive the command/address signal CA and the chip selection signal CS having a level higher than the reference voltage VREF. Thus, it may take a relatively long time the drive signal PDS, which is activated, to fully reach the second logic level higher than the reference voltage VREF as compared with a case that the buffer circuit (131 of FIG. 4) has no defective circuit.

The sampling code output circuit 115 may receive the initialization pulse INTP from the initialization pulse generation circuit 111 and may receive the drive signal PDS from the drive signal generation circuit 113. The sampling code output circuit 115 may generate the sampling code SAP_C based on the initialization pulse INTP and the drive signal PDS. When the initialization pulse INTP is generated by termination of the initialization operation and a level of the drive signal PDS is boosted into the second logic level by the termination of the initialization operation, the sampling code output circuit 115 may generate a sampled oscillation signal (S_OSC of FIG. 8) by sampling an oscillation signal (OSC of FIG. 8) and may generate the sampling code SAP_C by performing a count operation for counting the sampled oscillation signal (S_OSC of FIG. 8). The number of times that the sampled oscillation signal (S_OSC of FIG. 8) is counted may increase when a period it takes the drive signal PDS having the first logic level to reach the second logic level becomes longer due to the defect of the buffer circuit (131 of FIG. 4). Thus, in such a case, the sampling code output circuit 115 may generate the sampling code SAP_C having a set value which is more increased as compared with a case that the buffer circuit (131 of FIG. 4) has no defective circuit.

Figure 3:
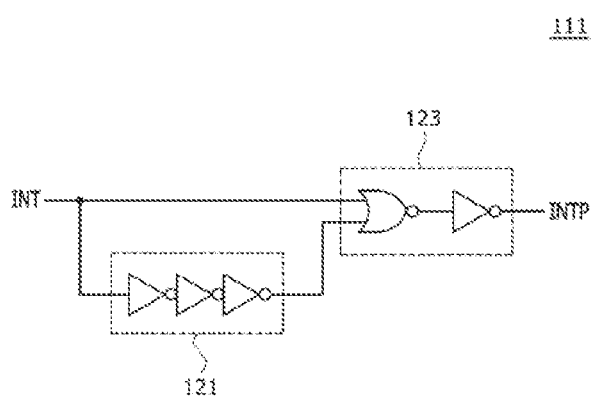
FIG. 3 is a circuit diagram illustrating a configuration of an initialization pulse generation circuit included in the sampling code generation circuit illustrated in FIG. 2.

As illustrated in FIG. 3, the initialization pulse generation circuit 111 may include an inversion delay circuit 121 and a pulse output circuit 123. The inversion delay circuit 121 may be realized using an inverter chain. The inversion delay circuit 121 may receive and delay the initialization signal INT by a certain delay period and may invert the delayed signal of the initialization signal INT to output the inverted signal of the delayed signal of the initialization signal INT. The pulse output circuit 123 may perform a logical OR operation of the initialization signal INT and an output signal of the inversion delay circuit 121 to generate the initialization pulse INTP. The initialization pulse generation circuit 111 may receive the initialization signal INT, a level of which is changed from a logic "high" level into a logic "low" level when the initialization operation terminates, to generate the Initialization pulse INTP in synchronization with an end point in time of the initialization operation. The initialization pulse INTP may be generated to have a logic "high" level during the certain delay period, which is set by the inversion delay circuit 121, at the end point in time of the initialization operation.

Figure 4:
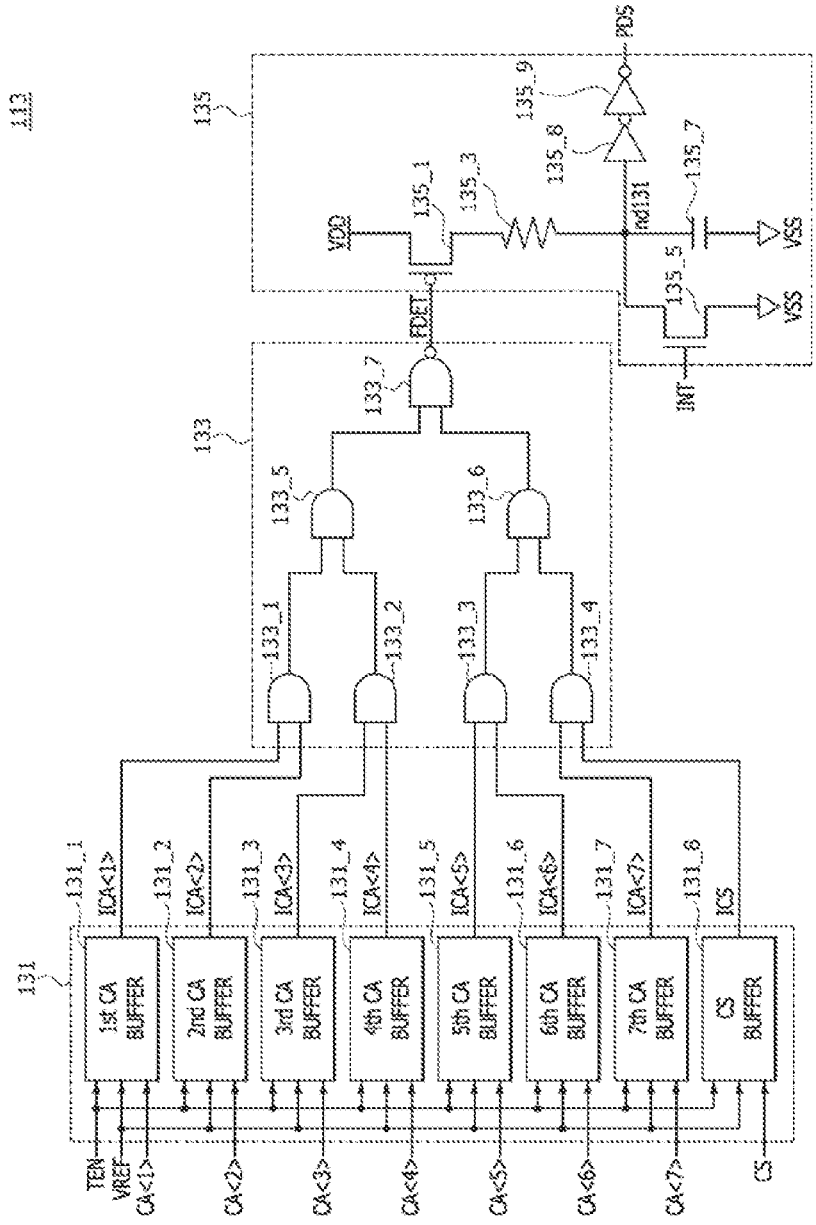
FIG. 4 illustrates a configuration of a drive signal generation circuit included in the sampling code generation circuit illustrated in FIG. 2.

As illustrated in FIG. 4, the drive signal generation circuit 113 may include the buffer circuit 131, a failure detection signal generation circuit 133, and a drive signal output circuit 135.

The buffer circuit 131 may include a first buffer 131_1, a second buffer 131_2, a third buffer 131_3, a fourth buffer 131_4, a fifth buffer 131_5, a sixth buffer 131_6, a seventh buffer 131_7, and an eighth buffer 131_8. The first buffer 131_1 may correspond to a first command/address buffer and may generate a first bit ICA<1> of an internal command/address signal ICA from a first bit CA<1> of the command/address signal CA based on the test signal TEN and the reference voltage VREF. The first buffer 131_1 may buffer the first bit CA<1> of the command/address signal CA based on the reference voltage VREF to generate the first bit ICA<1> of the internal command/address signal ICA, when the test signal TEN having the second logic level is input to the first buffer 131_1 during the test operation. The second to seventh buffers 131_2~131_7 may correspond to respective ones of second to seventh command/address buffers and may generate second to seventh bits ICA<2:7> of the internal command/address signal ICA from second to seventh bits CA<2:7> of the command/address signal CA based on the test signal TEN and the reference voltage VREF. The second to seventh buffers 131_2~131_7 may buffer the second to seventh bits CA<2:7> of the command/address signal CA based on the reference voltage VREF to generate the second to seventh bits ICA<2:7> of the internal command/address signal ICA, when the test signal TEN having the second logic level is input to the second to seventh buffers 131_2~131_7 during the test operation. The eighth buffer 131_8 may correspond to a chip selection buffer and may generate an internal chip selection signal ICS from the chip selection signal CS based on the test signal TEN and the reference voltage VREF. The eighth buffer 131_8 may buffer the chip selection CS based on the reference voltage VREF to generate the internal chip selection ICS, when the test signal TEN having the second logic level is input to the eighth buffer 131_8 during the test operation. While the test operation is performed, each of the first to seventh bits CA<1:7> of the command/address signal CA and the chip selection signal CS input to the buffer circuit 131 may be set to have a logic "high" level during a period corresponding to a test pulse width. When at least one of the first to eighth buffers 131_1~131_8 included in the buffer circuit 131 is a defective circuit, a pulse width (having a logic "high" level) of at least one of the first to seventh bits CA<1:7> of the command/address signal CA and the chip selection signal CS may be set to be less than the test pulse width. For example, when the third buffer 131_3 included in the buffer circuit 131 is a defective circuit, a pulse width (having a logic "high" level) of the third bit CA<3> of the command/address signal CA may be set to be less than the test pulse width.

The failure detection signal generation circuit 133 may include AND gates 133_1~133_6 and a NAND gate 133_7. The AND gate 133_1 may perform a logical AND operation of the first and second bits ICA<1:2> of the internal command/address signal ICA. The AND gate 133_2 may perform a logical AND operation of the third and fourth bits ICA<3:4> of the internal command/address signal ICA. The AND gate 133_3 may perform a logical AND operation of the fifth and sixth bits ICA<5:6> of the internal command/address signal ICA. The AND gate 133_4 may perform a logical AND operation of the seventh bit ICA<7> of the internal command/address signal ICA and the internal chip selection signal ICS. The AND gate 133_5 may perform a logical AND operation of an output signal of the AND gate 133_1 and an output signal of the AND gate 133_2. The AND gate 133_6 may perform a logical AND operation of an output signal of the AND gate 133_3 and an output signal of the AND gate 133_4. The NAND gate 133_7 may perform a logical NAND operation of an output signal of the AND gate 133_5 and an output signal of the AND gate 133_6 to generate a failure detection signal FDET. The failure detection signal generation circuit 133 may generate the failure detection signal FDET based on the first to seventh bits ICA<1:7> of the internal command/address signal ICA and the internal chip selection signal ICS. The failure detection signal generation circuit 133 may generate the failure detection signal FDET which is set to have a logic "low" level while all of the first to seventh bits ICA<1:7> of the internal command/address signal ICA and the internal chip selection signal ICS have a logic "high" level. A period that the failure detection signal FDET has a logic "low" level may be relatively longer in a case than the buffer circuit 131 has no defective circuit as compared with a case that the buffer circuit 131 has a defective circuit.

The drive signal output circuit 135 may include a PMOS transistor 135_1, a resistive element 135_3, an NMOS transistor 135_5, a capacitive element 135_7, and inverters 135_8 and 135_9. The PMOS transistor 135_1 and the resistive element 135_3 may be coupled in series between a supply terminal of a power source voltage VDD and a node nd131 to drive the node nd131 to the power source voltage VDD while the failure detection signal FDET has a logic "low" level. A voltage of the node nd131 may be driven to a logic "high" level more rapidly as a period that the failure detection signal FDET has a logic "low" level becomes longer. The NMOS transistor 135_5 may be coupled between the node nd131 and a supply terminal of a ground voltage VSS to drive and initialize the node nd131 to the ground voltage VSS (corresponding to a logic "low" level) when the Initialization signal INT having a logic "high" level is input to a gate of the NMOS transistor 135_5 during the initialization operation. The capacitive element 135_7 may be coupled between the node nd131 and the supply terminal of the ground voltage VSS to stably maintain a voltage level of the node nd131. The inverters 135_8 and 135_9 may be coupled in series to the node nd131 and may buffer a signal of the node nd131 to output the buffered signal of the node nd131 as the drive signal PDS.

Figure 5:
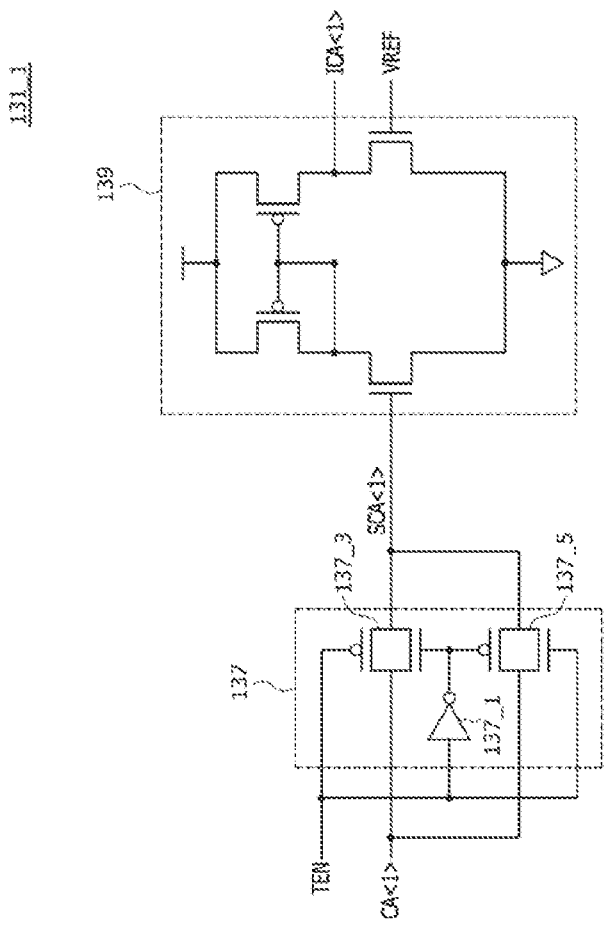
FIG. 5 is a circuit diagram illustrating a configuration of a first command/address buffer included in the drive signal generation circuit illustrated in FIG. 4.

As illustrated in FIG. 5, the first buffer 131_1 (i.e., the first command/address buffer) may include a selection/input circuit 137 and a differential amplification circuit 139.

The selection/input circuit 137 may include an inverter 137_1 and transfer gates 137_3 and 137_5. The inverter 137_1 may inversely buffer the test signal TEN to output the inversely buffered signal of the test signal TEN. While the test signal TEN has a logic "low" level for non-execution of the test operation, the transfer gate 137_3 may be turned to output the first bit CA<1> of the command/address signal CA as a first bit SCA<1> of a selection command/address signal SCA. While the test signal TEN has a logic "high" level for execution of the test operation, the transfer gate 137_5 may be turned to output the first bit CA<1> of the command/address signal CA as the first bit SCA<1> of the selection command/address signal SCA. In the present embodiment, a resistance value of the transfer gate 137_5 may be set to be higher than a resistance value of the transfer gate 137_3. Thus, a slope (i.e., a slew rate) of the first bit SCA<1> of the selection command/address signal SCA when a level of the first bit SCA<1> is changed from a logic "low" level into a logic "high" level during the test operation may be less than a slope (i.e., a slew rate) of the first bit SCA<1> of the selection command/address signal SCA when a level of the first bit SCA<1> is changed from a logic "low" level into a logic "high" level while the test operation is not performed. The resistance values of the transfer gates 137_3 and 137_5 may be set to be different according to the embodiments.

The differential amplification circuit 139 may receive the first bit SCA<1> of the selection command/address signal SCA from the selection/input circuit 137. The differential amplification circuit 139 may amplify a level of the first bit SCA<1> of the selection command/address signal SCA based on the reference voltage VREF to generate the first bit ICA<1> of the internal command/address signal ICA. For example, the differential amplification circuit 139 may generate the first bit SCA<1> (having a logic "low" level) of the selection command/address signal SCA when a level of the first bit SCA<1> of the selection command/address signal SCA is lower than a level of the reference voltage VREF and may generate the first bit SCA<1> (having a logic "high" level) of the selection command/address signal SCA when a level of the first bit SCA<1> of the selection command/address signal SCA is higher than a level of the reference voltage VREF.

Figure 6:
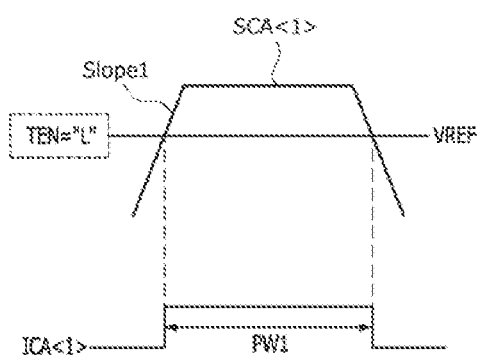
FIGS. 6 and 7 are timing diagrams illustrating an operation of the first command/address buffer illustrated in FIG. 5.
Figure 7:
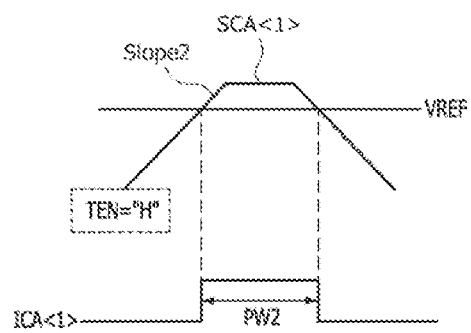

Referring to FIGS. 6 and 7, a wave form of the first bit SCA<1> of the selection command/address signal SCA, a logic level transition slope of which is adjusted according to execution/non-execution of the test operation, is illustrated, and a wave form of the first bit ICA<1> of the internal command/address signal ICA, a pulse width of which is adjusted according to execution/non-execution of the test operation, is also illustrated.

As illustrated in FIG. 6, when the test signal TEN has a logic "low(L)" level for non-execution of the test operation, the first bit CA<1> of the command/address signal CA may be transferred through the transfer gate 137_3 having a resistance value that is set to be lower than a resistance value of the transfer gate 137_5. Thus, a level of the first bit SCA<1> of the selection command/address signal SCA may change from a logic "low" level into a logic "high" level with a first slope SLOPE1, and the first bit ICA<1> of the internal command/address signal ICA may be generated to have a logic "high" level during a first pulse width PW1.

As illustrated in FIG. 7, when the test signal TEN has a logic "high(H)" level for execution of the test operation, the first bit CA<1> of the command/address signal CA may be transferred through the transfer gate 137_5 having a resistance value that is set to be higher than a resistance value of the transfer gate 137_3. Thus, a level of the first bit SCA<1> of the selection command/address signal SCA may change from a logic "low" level into a logic "high" level with a second slope SLOPE2 which is gentler (less) than the first slope SLOPE1, and the first bit ICA<1> of the internal command/address signal ICA may be generated to have a logic "high" level during a second pulse width PW2. Accordingly, the second pulse width PW2 may be set to be less than the first pulse width PW1.

Figure 8:
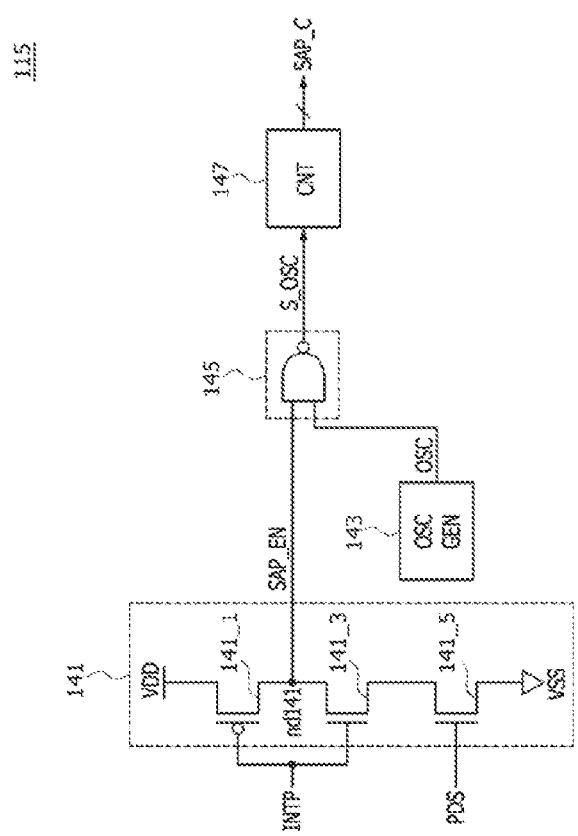
FIG. 8 illustrates a configuration of a sampling code output circuit included in the sampling code generation circuit illustrated in FIG. 2.

As illustrated in FIG. 8, the sampling code output circuit 115 may include a sampling period signal generation circuit 141, an oscillation signal generation circuit 143, an oscillation signal sampling circuit 145, and a counter 147.

The sampling period signal generation circuit 141 may include a PMOS transistor 141_1 and NMOS transistors 141_3 and 141_5. The PMOS transistor 141_1 may be coupled between the supply terminal of the power source voltage VDD and a node nd141 and may be turned on in response to the initialization pulse INTP. The NMOS transistors 141_3 and 141_5 may be coupled in series between the node nd141 and the supply terminal of the ground voltage VSS. The NMOS transistor 141_3 may be turned on in response to the initialization pulse INTP, and the NMOS transistor 141_5 may be turned on in response to the drive signal PDS. The sampling period signal generation circuit 141 may generate a sampling period signal SAP_EN based on the initialization pulse INTP and the drive signal PDS. The sampling period signal generation circuit 141 may drive the node nd141 to the power source voltage VDD by the PMOS transistor 141_1 which is turned on when the initialization pulse INTP has a logic "low" level in synchronization with an end point in time of the initialization operation, thereby generating the sampling period signal SAP_EN which is set to have a logic "high" level. The sampling period signal generation circuit 141 may drive the node nd141 to the ground voltage VSS by the NMOS transistors 141_3 and 141_5 which are turned on at a point in time when a level of the drive signal PDS changes from a logic "low" level into a logic "high" level while the initialization pulse INTP has a logic "high" level after the initialization pulse INTP is generated to have a logic "low" level.

The oscillation signal generation circuit 143 may generate an oscillation signal OSC. The oscillation signal OSC may be generated to be a periodic signal having a certain cycle. The oscillation signal generation circuit 143 may be realized using a general oscillator.

The oscillation signal sampling circuit 145 may receive the sampling period signal SAP_EN from the sampling period signal generation circuit 141 and may receive the oscillation signal OSC from the oscillation signal generation circuit 143. The oscillation signal sampling circuit 145 may sample the oscillation signal OSC while the sampling period signal SAP_EN has a logic "high" level to generate a sampled oscillation signal S_OSC. The oscillation signal sampling circuit 145 may be synchronized with an end point in time of the initialization operation to output the oscillation signal OSC, which is generated during a period from a point in time when the initialization pulse INTP is generated to have a logic "low" level until a point in time when a level of the drive signal PDS changes from a logic "low" level into a logic "high" level, as the sampled oscillation signal S_OSC. In an embodiment, the oscillation signal sampling circuit 145 may perform a logical NAND operation on the sampling period signal SAP_EN and the oscillation signal OSC to generate the sampled oscillation signal S_OSC.

The counter 147 may receive the sampled oscillation signal S_OSC from the oscillation signal sampling circuit 145. The counter 147 may count the sampled oscillation signal S_OSC to generate the sampling code SAP_C. A set value of the sampling code SAP_C may be set to change whenever the counter 147 performs the count operation during the sampling period. For example, when the sampling code SAP_C having five bits is initialized to have a binary stream of '00000', the counter 147 may count a first pulse of the sampled oscillation signal S_OSC to generate the sampling code SAP_C which is set to have a binary stream of '00001' (corresponding to a decimal number of '1') and may count a second pulse of the sampled oscillation signal S_OSC to generate the sampling code SAP_C which is set to have a binary stream of '00010' (corresponding to a decimal number of '2'). Similarly, when the sampling code SAP_C having five bits is initialized to have a binary stream of '00000', the counter 147 may count a thirtieth pulse of the sampled oscillation signal S_OSC to generate the sampling code SAP_C which is set to have a binary stream of '11110' (corresponding to a decimal number of '30') and may count a thirty first pulse of the sampled oscillation signal S_OSC to generate the sampling code SAP_C which is set to have a binary stream of '11111' (corresponding to a decimal number of '31'). Although the present embodiment illustrates in conjunction with a case that the sampling code SAP_C has five bits and the counter 147 counts up to the thirty first pulse of the sampled oscillation signal S_OSC, the present embodiment is merely an example of the present disclosure. Accordingly, the present disclosure is not limited to the present embodiment.

The test operation of the semiconductor device 100 will be described hereinafter with reference to FIG. 9.

Figure 9:
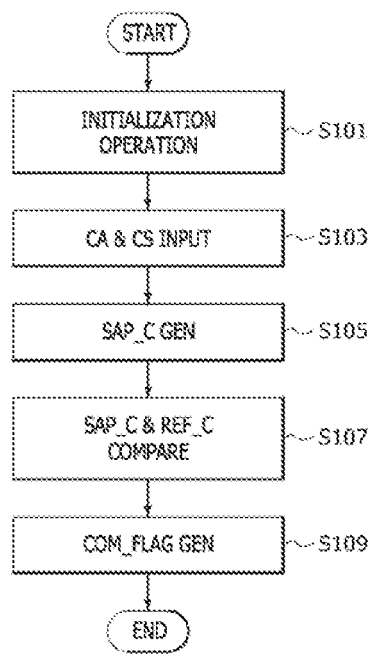

As illustrated in FIG. 9, when the initialization operation is performed at a step S101, the initialization INT may be set to have a logic "high" level and the drive signal PDS may be initialized to have a logic "low" level. When the test operation commences after termination of the initialization operation, the command and the address may be input to the buffer circuit 131 (see a step S103). The sampling period may be adjusted according to whether the buffer circuit 131 is a defective circuit, and the sampled oscillation signal S_OSC may be counted during the sampling period to generate the sampling code SAP_C (see a step S105). The sampling code SAP_C may be compared with the reference code REF_C which is set to provide a reference value which is capable of determining whether the buffer circuit 131 is a defective circuit (see a step S107). The comparison flag COM_FLAG may be generated by comparing the sampling code SAP_C with the reference code REF_C (see a step S109). The comparison flag COM_FLAG generated during the test operation may include information on whether the buffer circuit 131 is a defective circuit. Thus, whether the buffer circuit 131 is a defective circuit may be easily determined using a logic level of the comparison flag COM_FLAG.

The test operation of the semiconductor device 100 performed when the buffer circuit 131 has no defective circuit will be described hereinafter with reference to FIGS. 10 to 14.

Figure 10:
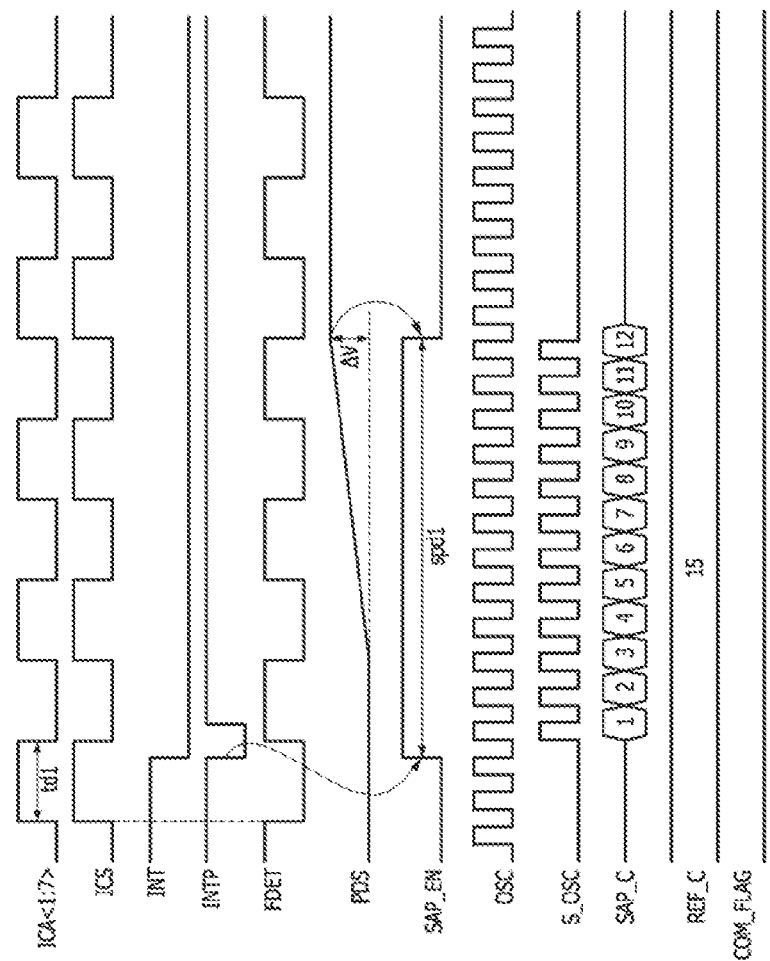
Figure 11:
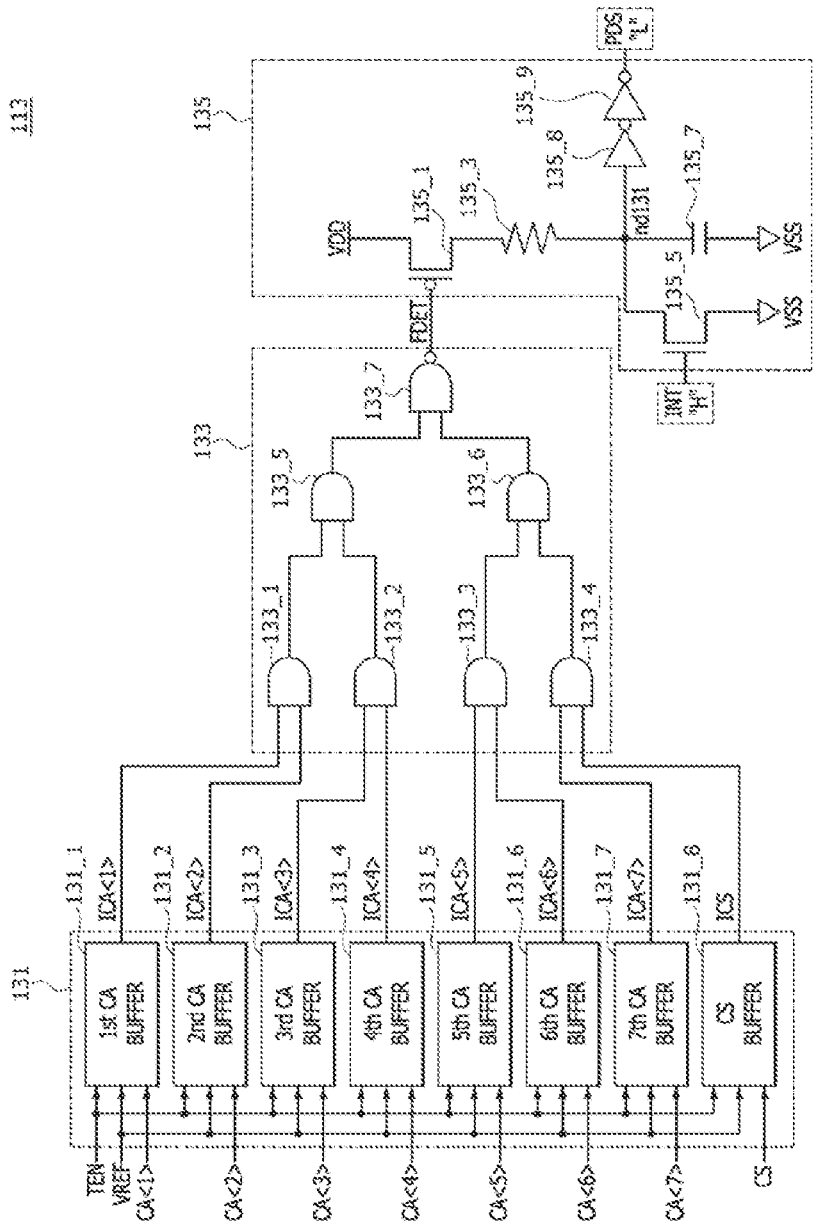

As illustrated in FIGS. 10 and 11, while the initialization operation is performed by the Initialization signal INT which is set to have a logic "high" level, the NMOS transistor 135_5 included in the drive signal output circuit 135 may be turned on to drive the node nd131 to the ground voltage VSS and the drive signal PDS outputted through the inverters 135_8 and 135_9 may be initialized to have a logic "low" level.

Figure 12:
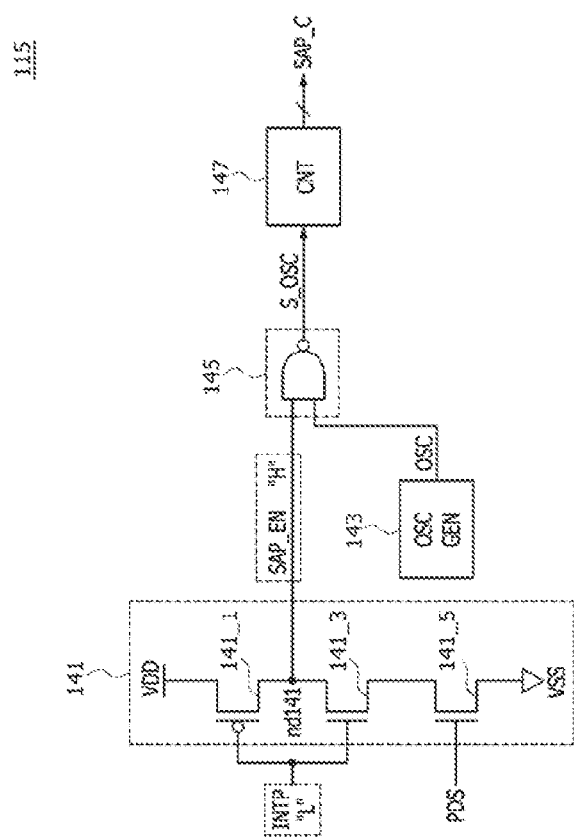

As illustrated in FIGS. 10 and 12, when the initialization pulse INTP is generated to have a logic "low" level by termination of the Initialization operation, the PMOS transistor 141_1 included in the sampling period signal generation circuit 141 may be turned on to drive the node nd141 to the power source voltage VDD and the sampling period signal SAP_EN outputted through the node nd141 may be set to have a logic "high(H)" level.

Figure 13:
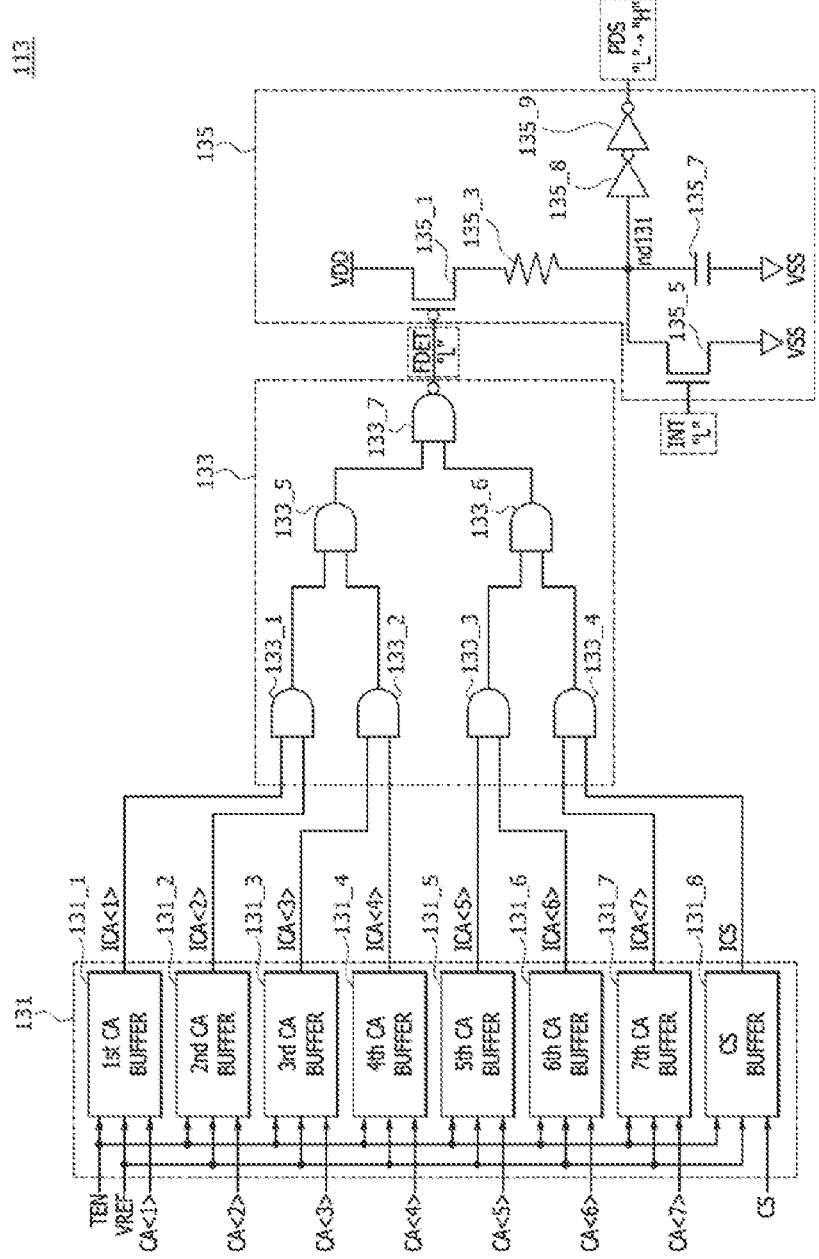

As illustrated in FIGS. 10 and 13, when each of the first to seventh bits CA<1:7> of the command/address signal CA and the chip selection signal CS is set to have a logic "high" level during a period corresponding to the test pulse width by the test operation and is input to the buffer circuit 131, all of the first to seventh bits ICA<1:7> of the internal command/address signal ICA and the internal chip selection signal ICA outputted from the buffer circuit 131 may be generated to have an internal test pulse width 'td1'. Because the failure detection signal generation circuit 133 sequentially receives the first to seventh bits ICA<1:7> of the internal command/address signal ICA and the internal chip selection signal ICA having the internal test pulse width 'td1' to generate the failure detection signal FDET, the failure detection signal FDET may be set to include a plurality of pulses, which are sequentially generated to have a logic "low" level and each of which is generated during the internal test pulse width 'td1'. The drive signal output circuit 135 may boost a level of the drive signal PDS by a predetermined voltage difference 'ΔV' based on the failure detection signal FDET such that a level of the drive signal PDS is changed from a logic "low" level into a logic "high" level.

Figure 14:
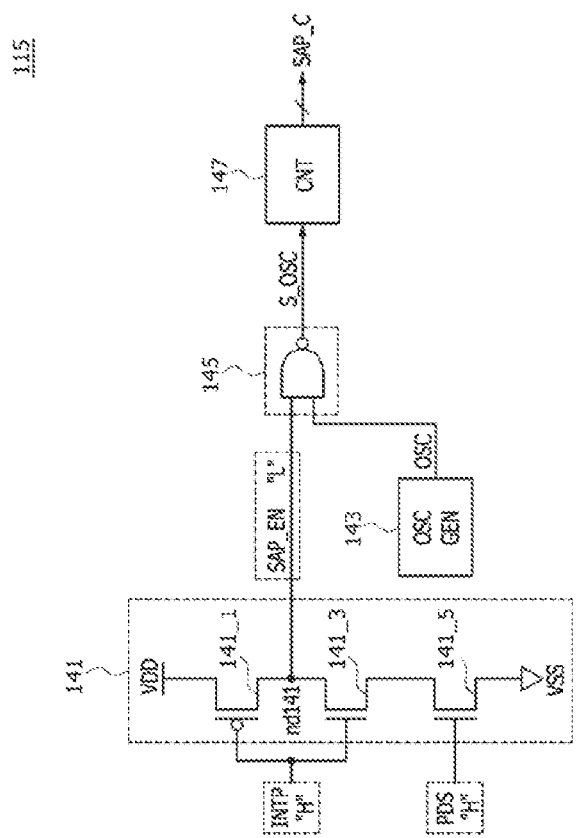

As illustrated in FIGS. 10 and 14, when a level of the drive signal PDS changes from a logic "low" level into a logic "high" level while the initialization pulse INTP maintains a logic "high" level after termination of the initialization operation, the NMOS transistors 141_3 and 141_5 included in the sampling period signal generation circuit 141 may be turned on to drive the node nd141 to the ground voltage VSS and the sampling period signal SAP_EN outputted through the node nd141 may be set to have a logic "low(L)" level.

As illustrated in FIG. 10, a period from a point in time when a level of the sampling period signal SAP_EN is changed from a logic "low" level into a logic "high" level by the initialization pulse INTP until a point in time when a level of the sampling period signal SAP_EN is changed from a logic "high" level into a logic "low" level by the drive signal PDS may be set as a sampling period 'spd1'. As illustrated in FIGS. 10 and 12, the oscillation signal sampling circuit 145 may sample the oscillation signal OSC generated by the oscillation signal generation circuit 143 during the sampling period 'spd1' to generate the sampled oscillation signal S_OSC, and the counter 147 may count the sampled oscillation signal S_OSC to generate the sampling code SAP_C. A set value of the sampling code SAP_C may be set to have a binary stream of '01100' corresponding to a decimal number of '12' because the count operation is performed twelve times during the sampling period 'spd1'. In such a case, because a set value of the reference code REF_C is set to have a binary stream of '01111' (corresponding to a decimal number of '15') greater than the set value of the sampling code SAP_C (corresponding to a decimal number of '12'), the comparison flag COM_FLAG may be generated to have a logic "low" level. Accordingly, the buffer circuit 131 may be regarded as a normal buffer circuit without any defective circuit through the comparison flag COM_FLAG having a logic "low" level.

The test operation of the semiconductor device 100 performed when the seventh buffer 131_7 among the first to eighth buffers 131_1~131_8 included in the buffer circuit 131 is a defective circuit will be described hereinafter with reference to FIG. 15.

First, when the initialization signal INT is set to have a logic "high" level while the initialization operation is performed, the drive signal PDS may be initialized to have a logic "low" level.

Next, when the initialization pulse INTP is generated to have a logic "low" level by termination of the initialization operation, the sampling period signal SAP_EN may be set to have a logic "high" level.

Subsequently, when each of the first to seventh bits CA<1:7> of the command/address signal CA and the chip selection signal CS is set to have a logic "high" level during a period corresponding to the test pulse width by execution of the test operation and the first to seventh bits CA<1:7> of the command/address signal CA and the chip selection signal CS are input to respective ones of the first to eighth buffers 131_1~131_8, all of the first to sixth bits ICA<1:6> of the internal command/address signal ICA and the internal chip selection signal ICS outputted from the first to sixth buffers 131_1~131_6 and the eighth buffer 131_8 may be generated to have a first internal test pulse width 'td2' and the seventh bit ICA<7> of the internal command/address signal ICA outputted from the seventh buffer 131_7 may be generated to have a second internal test pulse width 'td3'. The failure detection signal FDET may be set to include a plurality of pulses, which are sequentially generated to have a logic "low" level and each of which is generated during the second internal test pulse width 'td3' by the seventh bit ICA<7> of the internal command/address signal ICA outputted from the seventh buffer 131_7 corresponding to a defective buffer. A level of the drive signal PDS may be boosted by a predetermined voltage difference 'ΔV' based on the failure detection signal FDET to change from a logic "low" level into a logic "high" level.

Next, when a level of the drive signal PDS changes from a logic "low" level into a logic "high" level while the initialization pulse INTP maintains a logic "high" level after termination of the initialization operation, the sampling period signal SAP_EN may be set to have a logic "low(L)" level. A period from a point in time when a level of the sampling period signal SAP_EN is changed from a logic "low" level into a logic "high" level by the initialization pulse INTP until a point in time when a level of the sampling period signal SAP_EN is changed from a logic "high" level into a logic "low" level by the drive signal PDS may be set as a sampling period 'spd2'. A set value of the sampling code SAP_C may be set to have a binary stream of '10101' corresponding to a decimal number of '21' because the count operation is performed twenty-one times during the sampling period 'spd2'. In such a case, because a set value of the reference code REF_C is set to have a binary stream of '01111' (corresponding to a decimal number of '15') less than the set value of the sampling code SAP_C (corresponding to a decimal number of '21'), the comparison flag COM_FLAG may be generated to have a logic "high" level. Accordingly, the buffer circuit 131 may be regarded as a defective buffer through the comparison flag COM_FLAG having a logic "high" level.

As described above, a sampling period may be adjusted according to whether a buffer circuit receiving a command/address signal and a chip selection signal is a defective circuit, and a sampling code generated by a count operation may be compared with a reference code during the sampling period to generate a comparison flag including information on whether the buffer circuit is a defective circuit. Thus, whether the buffer circuit receiving the command/address signal and the chip selection signal is a defective circuit may be easily determined using a logic level of the comparison flag.

The concepts have been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint but an illustrative standpoint. The scope of the concepts is not limited to the above descriptions but defined by the accompanying claims, and all of distinctive features in the equivalent scope should be construed as being included in the concepts.

What is claimed is:

1. A semiconductor device comprising:
   a sampling code generation circuit including a buffer circuit configured to receive an external set signal, wherein the sampling code generation circuit is configured to perform a count operation during a sampling period, the sampling period adjusted based on an output signal of the buffer circuit to generate a sampling code; and
   a code comparator circuit configured to compare the sampling code with a reference code to generate a comparison flag.

2. The semiconductor device of claim 1, wherein the external set signal includes a command and address signal and a chip selection signal.

3. The semiconductor device of claim 1, wherein the sampling code generation circuit adjusts the sampling period to be longer when the buffer circuit is a defective circuit as compared with when the buffer circuit has no defective circuit.

4. The semiconductor device of claim 1, wherein the sampling code generation circuit samples an oscillation signal during the sampling period and counts the sampled oscillation signal to generate the sampling code.

5. The semiconductor device of claim 4, wherein the sampling code generation circuit includes:
   a drive signal generation circuit configured to generate a drive signal based on an output signal of the buffer circuit; and
   a sampling code output circuit configured to generate the sampling code based on an initialization pulse and the drive signal.

6. The semiconductor device of claim 5, wherein the sampling code generation circuit further includes an initialization pulse generation circuit configured to generate the initialization pulse at an end point in time of an initialization operation.

7. The semiconductor device of claim 5, wherein a logic level transition period of the drive signal generated by the drive signal generation circuit is set to be longer when the buffer circuit is a defective circuit as compared with when the buffer circuit has no defective circuit.

8. The semiconductor device of claim 5, wherein the drive signal generation circuit includes:
   a failure detection signal generation circuit configured to generate a failure detection signal based on an output signal of the buffer circuit; and
   a drive signal output circuit configured to drive the drive signal, which is set to have a first logic level during an initialization operation, to a second logic level based on the failure detection signal.

9. The semiconductor device of claim 5, wherein the sampling code output circuit includes:
   an oscillation signal sampling circuit configured to sample an oscillation signal during the sampling period to generate a sampled oscillation signal; and
   a counter circuit configured to count the sampled oscillation signal to change a set value of the sampling code.

10. The semiconductor device of claim 5, wherein the sampling period is set as a period from a point in time when the initialization pulse is generated until a point in time when logic level transition of the drive signal occurs.

11. The semiconductor device of claim 1, further comprising a reference code storage circuit configured to output the reference code providing a reference value for determining whether the buffer circuit is a defective circuit.

12. The semiconductor device of claim 1, wherein the buffer circuit is configured to receive the external set signal, wherein a slew rate of the external set signal is varied according to a test signal.

13. A semiconductor device comprising:
    a sampling code generation circuit configured to sample an oscillation signal during a sampling period, the sampling period adjusted according to whether a buffer circuit is a defective circuit to generate a sampled oscillation signal and configured to count the sampled oscillation signal to generate a sampling code; and
    a code comparator circuit configured to compare the sampling code with a reference code to generate a comparison flag.

14. The semiconductor device of claim 13, wherein the buffer circuit receives a command and address signal and a chip selection signal.

15. The semiconductor device of claim 13, wherein the sampling code generation circuit includes:

a drive signal generation circuit configured to generate a drive signal based on an output signal of the buffer circuit; and a sampling code output circuit configured to generate the sampling code based on an initialization pulse and the drive signal.

16. The semiconductor device of claim 15, wherein a logic level transition period of the drive signal generated by the drive signal generation circuit is set to be longer when the buffer circuit is a defective circuit as compared with when the buffer circuit has no defective circuit.

17. The semiconductor device of claim 15, wherein the drive signal generation circuit includes:

a failure detection signal generation circuit configured to generate a failure detection signal based on an output signal of the buffer circuit; and a drive signal output circuit configured to drive the drive signal, which is set to have a first logic level during an initialization operation, to a second logic level based on the failure detection signal.

18. The semiconductor device of claim 15, wherein the sampling code output circuit includes:

an oscillation signal sampling circuit configured to sample the oscillation signal during the sampling period to generate a sampled oscillation signal; and a counter circuit configured to count the sampled oscillation signal to change a set value of the sampling code.

19. The semiconductor device of claim 15, wherein the sampling period is set as a period from a point in time when the initialization pulse is generated until a point in time when logic level transition of the drive signal occurs.

20. A semiconductor device comprising:

a buffer circuit configured to receive a command and address signal and a chip selection signal to generate an output signal based on an internal command/address signal and an internal chip selection signal;

a failure detection signal generation circuit configured to generate a failure detection signal based on the internal command/address signal and the internal chip selection signal;

a drive signal output circuit configured to drive the drive signal, which is initialized during an initialization operation, based on the failure detection signal such that a logic level transition of the drive signal occurs;

a sampling code output circuit configured to generate the sampling code based on an initialization pulse and the drive signal; and a code comparator circuit configured to compare the sampling code with a reference code to generate a comparison flag, wherein the sampling code output circuit includes an oscillation signal sampling circuit configured to sample an oscillation signal during a sampling period, the sampling period adjusted based on the output signal of the buffer circuit.

21. The semiconductor device of claim 20, wherein the sampling code output circuit includes:

the oscillation signal sampling circuit configured to sample the oscillation signal during a sampling period to generate a sampled oscillation signal; and a counter circuit configured to count the sampled oscillation signal to change a set value of the sampling code.

22. The semiconductor device of claim 21, wherein the sampling period is set as a period from a point in time when the initialization pulse is generated until a point in time when logic level transition of the drive signal occurs.

23. The semiconductor device of claim 20, further comprising a reference code storage circuit configured to output the reference code providing a reference value for determining whether the buffer circuit is a defective circuit.

* * * * *